(12) United States Patent
Xie

(10) Patent No.: US 10,243,142 B2
(45) Date of Patent: Mar. 26, 2019

(54) DISPLAY PANEL, ORGANIC LIGHT EMITTING DIODE AND METHOD FOR MANUFACTURING THE SAME

(71) Applicants: SHANGHAI TIANMA AM-OLED CO., LTD., Shanghai (CN); TIANMA MICRO-ELECTRONICS CO., LTD., Shenzhen (CN)

(72) Inventor: Zaifeng Xie, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 202 days.

(21) Appl. No.: 14/990,335

(22) Filed: Jan. 7, 2016

(65) Prior Publication Data

US 2017/0077406 A1 Mar. 16, 2017

(30) Foreign Application Priority Data

Sep. 11, 2015 (CN) .......................... 2015 1 0575611

(51) Int. Cl.
*H01L 51/52* (2006.01)
*H01L 51/00* (2006.01)
(Continued)

(52) U.S. Cl.
CPC ...... *H01L 51/0045* (2013.01); *H01L 27/3244* (2013.01); *H01L 51/0048* (2013.01); *H01L 51/5004* (2013.01); *H01L 51/5246* (2013.01); *H01L 51/56* (2013.01); *H01L 51/508* (2013.01); *H01L 51/5072* (2013.01); *H01L 2227/323* (2013.01); *H01L 2251/5369* (2013.01); *H01L 2251/552* (2013.01)

(58) Field of Classification Search
CPC ........... H01L 27/3244; H01L 2227/323; H01L 51/56; H01L 51/5246; H01L 51/5072; H01L 51/5004; H01L 51/0045; H01L 51/0048; H01L 51/508; H01L 2251/552; H01L 2251/5369

See application file for complete search history.

(56) References Cited

U.S. PATENT DOCUMENTS 6,013,384 A * 1/2000 Kido ................... H01L 51/5052
313/504
8,384,071 B2 2/2013 Yang et al.
(Continued)

FOREIGN PATENT DOCUMENTS

CN 101436645 A 5/2009
CN 101882665 A 11/2010
(Continued)

*Primary Examiner* — Golam Mowla
(74) *Attorney, Agent, or Firm* — Kilpatrick Townsend & Stockton LLP

(57) ABSTRACT

A display panel, a polymer light emitting diode and a method for manufacturing the same are provided. The polymer light emitting diode includes: an organic light emitting layer having a first surface and a second surface opposite to each other; a hole transport part formed on the first surface of the organic light emitting layer; and an electron transport part formed on the second surface of the organic light emitting layer, the electron transport part including a nanocomposite layer.

8 Claims, 4 Drawing Sheets

(51) Int. Cl.
*H01L 27/32* (2006.01)
*H01L 51/50* (2006.01)
*H01L 51/56* (2006.01)

(56) References Cited

U.S. PATENT DOCUMENTS

| | | | |
|---|---|---|---|
| 8,729,597 B2 | 5/2014 | Kim et al. | |
| 2002/0004146 A1* | 1/2002 | Kido | H01L 51/5092 |
| | | | 428/690 |
| 2003/0006411 A1* | 1/2003 | Kido | H01L 51/0035 |
| | | | 257/40 |
| 2003/0184221 A1* | 10/2003 | Mishima | H01L 51/5259 |
| | | | 313/512 |
| 2008/0237612 A1* | 10/2008 | Cok | B82Y 20/00 |
| | | | 257/88 |
| 2012/0161106 A1* | 6/2012 | Kim | H01L 31/035209 |
| | | | 257/29 |
| 2012/0267602 A1* | 10/2012 | Kim | H01L 51/002 |
| | | | 257/9 |
| 2013/0240847 A1 | 9/2013 | Zakhidov et al. | |
| 2014/0110665 A1* | 4/2014 | Zhang | H01L 51/502 |
| | | | 257/13 |
| 2015/0280227 A1* | 10/2015 | He | H01M 4/0459 |
| | | | 429/246 |

FOREIGN PATENT DOCUMENTS

| | | |
|---|---|---|
| CN | 102185113 A | 9/2011 |
| CN | 103078064 A | 5/2013 |
| CN | 103548171 A | 1/2014 |
| CN | 104183830 A | 12/2014 |
| CN | 104854720 A | 8/2015 |
| EP | 1666562 A2 | 6/2006 |

\* cited by examiner

DISPLAY PANEL, ORGANIC LIGHT EMITTING DIODE AND METHOD FOR MANUFACTURING THE SAME

CROSS-REFERENCE TO RELATED APPLICATIONS

This application is based upon and claims priority to Chinese Patent Application 201510575611.3, filed Sep. 11, 2015, the entire contents of which are incorporated herein by reference.

TECHNICAL FIELD

The present disclosure generally relates to fields of display technology, and more particularly, to a polymer light emitting diode, a method for manufacturing the polymer light emitting diode, and a display panel including the polymer light emitting diode.

BACKGROUND

With rapid development of science and technology, demands for display panels are increasingly improved, which tend to become lighter and thinner with less power consumed. Accordingly, there emerges organic light emitting diode (OLED) display panel. Compared to conventional liquid crystal display panel, the OLED display panel is self-luminous without backlight module having high energy consumption and, hence, is lighter and thinner with less power consumed. Thus, more and more attention is paid to the OLED display panel.

Depending on different organic light emitting material adopted, OLED in the OLED display panel may be classified into small molecule light emitting diode (SMLED) and polymer light emitting diode (PLED). In comparison, the SMLED may be manufactured with a vacuum thermal evaporator having high cost and not suit for application in large area display panels, while the PLED may be manufactured more easily with reduced costs on equipments and process via wet methods such as solution spin coating or droplet coating, and suit for application in the large area display panels.

A proper device structure is of key importance in improving characteristics of the PLED such as brightness, current efficiency and stability. Referring to FIG. 1, which illustrates a block diagram of a conventional PLED, the PLED mainly includes a hole transport part 1', an organic light emitting layer 2' and an electron transport part 3' stacked sequentially. Principle for the PLED to emit light may be described as follows. Holes injected through the hole transport part 1' are combined with electrons injected through the electron transport part 3' in the organic light emitting layer 2' to generate excitons so as to emit light. Herein, the hole transport part 1' and the electron transport part 3' serve mainly to address imbalance between injections of two types of carries, wherein the hole transport part 1' may include an anode 10', a hole injection layer (HIL) 11' and a hole transport layer (HTL) 12', while the electron transport part 3' may include a cathode 30' and an electron transport layer (ETL) 31', and may further include an electron injection layer (EIL) in certain kinds of PLED (not shown).

Generally speaking, however, organic polymer light emitting material is of partial hole transport type, and hole transport capability of the hole transport part in the PLED is far greater than electron transport capability of the electron transport part therein. Accordingly, during startup of the PLED, an exciton combination region may be generated closer to the electron transport part by holes and electrons. Excitons may be further de-excited at an interface between the electron transport part and the organic light emitting layer or even in the electron transport part, such that spectroscopic redshift may occur in the PLED.

SUMMARY

The present disclosure is directed to provide a polymer light emitting diode, a method for manufacturing the polymer light emitting diode, and a display panel including the polymer light emitting diode.

Other features and advantages of the disclosure may be apparent through detailed description hereinafter, or may be obtained through implementation thereof.

According to a first aspect the present disclosure, there is provided an organic light emitting diode, including:

an organic light emitting layer having a first surface and a second surface opposite to each other;

a hole transport part formed on the first surface of the organic light emitting layer; and an electron transport part formed on the second surface of the organic light emitting layer, the electron transport part including a nanocomposite layer.

According to a second aspect the present disclosure, there is provided a method for manufacturing an organic light emitting diode, including:

forming a hole transport part configured to provide hole carriers;

forming an organic light emitting layer on the hole transport part; and forming an electron transport part on the organic light emitting layer, the electron transport part including a nanocomposite layer.

According to a third aspect the present disclosure, there is provided an organic light emitting display panel, including:

a first substrate;

a second substrate provided opposite to the first substrate;

an organic light emitting diode such as the organic light emitting diode described in paragraphs 0009-0010 is provided between the first substrate and the second substrate; and a seal member provided around the organic light emitting diode and configured to package the organic light emitting diode between the first substrate and the second substrate.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

Features and advantages of the present disclosure described above as well as other features and advantages thereof may become more apparent through detailed description of exemplary embodiments by reference to the accompanying drawings.

DETAILED DESCRIPTION

Figure 1:
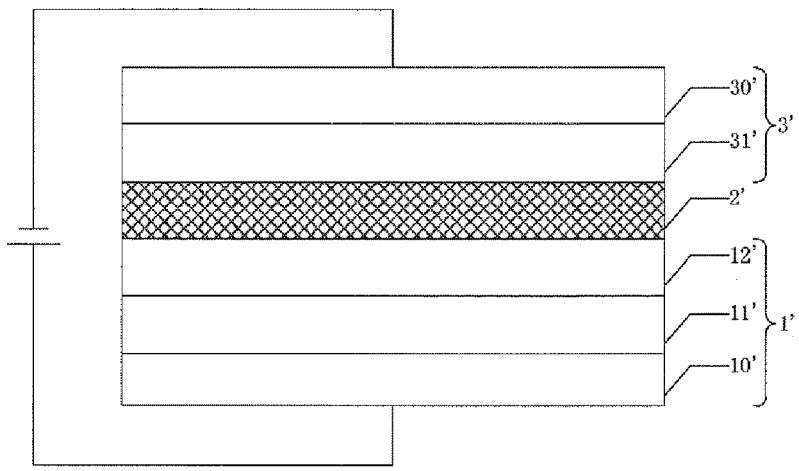
FIG. 1 is a schematic diagram illustrating a PLED in prior art.

Description will now be made in detail to exemplary embodiments by reference to the accompanying drawings. However, the exemplary embodiments may be implemented in various ways rather than being understood as limited to those embodiments described herein. Instead, those embodiments are provided to illustrate the disclosure comprehensively and completely, and to deliver concept of the exemplary embodiments entirely to those skilled in the art. Like elements are represented by like reference signs in the drawings and detailed description thereof may be omitted.

Furthermore, features, structures or properties described herein may be combined into one or more embodiments in any proper ways. Detailed description will be made hereinafter to enable the embodiments of the disclosure to be comprehensible. However, it should be noted for those skilled in the art, technical solution of the disclosure may be implemented by means of alternative structures, materials or processes instead of one or more of those specific elements described herein. Otherwise, structures, processes or operations well known in the art may be not illustrated or described herein for fear of obscuring aspects of the disclosure.

There is provided an OLED in the exemplary embodiments, particularly a PLED. PLEDs may be classified into a bottom emission type and a top emission type depending on direction of light emission. Taking the bottom emission type for an example, referring to FIG. 2, the PLED includes mainly a hole transport part 1, an organic light emitting layer 2 and an electron transport part 3. Herein, the organic light emitting layer 2 includes a first surface and a second surface (for example upper side surface and lower side surface as shown in the drawing) opposite to each other. The hole transport part 1 is stacked on the lower side surface of the organic light emitting layer 2, and includes an anode 10, a hole injection layer (HIL) 11 and a hole transport layer (HTL) 12. The electron transport part 3 is stacked on the upper side surface of the organic light emitting layer 2, and includes a nanocomposite layer 32 and a cathode 30. The anode 10 may be made from materials with high work function and good transparency, for example transparent conductive oxides such as transparent ITO (Indium Tin Oxide) conductive membrane. The cathode 30 may be made from transparent conductive materials, for example Al, Ca, In or Mg—Al alloy transparent conductive membrane.

Intermolecular distance in process of charge carrier hopping may be considered as equivalent to electron mean free path in conductive systems of either narrow broadband or wide broadband. As can be known from following formula: $u=\{ea^2/K_BT\}K_{ET}$ (wherein u denotes electron mobility, e denotes electron charge, a denotes intermolecular distance, $K_B$ denotes Boltzmann constant, T denotes thermodynamic temperature, and $K_{ET}$ denotes a probability of electron hopping per unit time), magnitude of the electron mobility may depend on the electron mean free path upon conduction of charges in the material per se. The greater the electron mean free path is, the higher the conductivity thereof is, and vice versa. In the present exemplary embodiment, the nanocomposite layer 32 is used as material of the electron transport part 3 so as to increase the electron mean free path of the electrons in the electron transport part 3 and, hence, to enhance electron transport capability of the electron transport part 3 to be kept in balance with hole transport capability of the PLED. Accordingly, excitons can be held within the organic light emitting layer 2 and, thus, current efficiency of the PLED can be improved.

Figure 3:
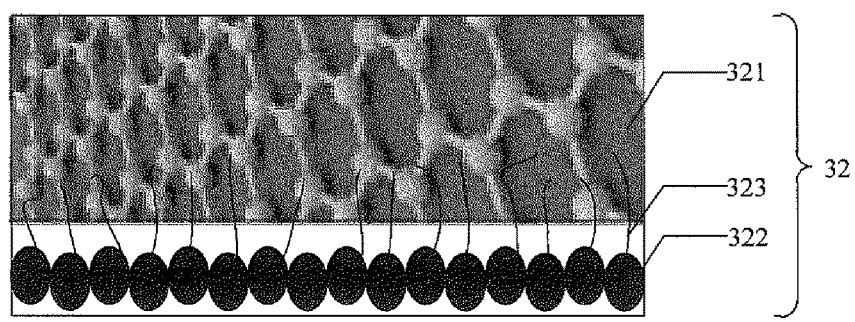
FIG. 3 is a schematic diagram illustrating a nanocomposite layer according to FIG. 2.

There is further provided an implementation mode of the nanocomposite layer 32 described above in the exemplary embodiments. As shown in FIG. 3, the nanocomposite layer 32 includes: an electron rich carrier 321, and a transition metal oxide (TMO) nanoparticle film 322 or a metalloid oxide nanoparticle film 322. The transition metal oxide nanoparticle film 322 or the metalloid oxide nanoparticle film 322 is anchored on the electron rich carrier 321. For example, the electron rich carrier 321 may include a π-electron rich planar system film formed of graphene (RGO) or carbon nano tube (CNT). Metal in the transition metal oxide or metalloid in the metalloid oxide may be selected from IIIB group, IVB group, VB group, VIB group, VIIB group, IB group, IIB group, IIIA group, IVA group, VA group, or VIA group. For example, the transition metal oxide may include $TiO_2$ (the nanocomposite layer 32 formed thereof may have an energy level of about 7.6 ev) or ZnO (the nanocomposite layer 32 formed thereof may have an energy level of about 7.6 ev), while the metalloid oxide may include $Ge_2O_5$ (the nanocomposite layer 32 formed thereof may have an energy level of about 7.2 ev) or $As_2O_5$ (the nanocomposite layer 32 formed thereof may have an energy level of about 7.3 ev). Moreover, it should be understood by those skilled in the art, the nanocomposite layer 32 with those features described above may be also implemented by other kinds of material in additional exemplary embodiments of the disclosure, rather than being limited to those described in the present exemplary embodiment.

The TMO nanoparticle film 322 and the RGO carrier are taken for example hereinbelow. The TMO nanoparticle film 322 is of high specific surface area and great electron mean free path and, hence, can be of relatively high electron transport capability. Accordingly, electrons can be conducted rapidly outward of the TMO nanoparticle film 322 and, thus, the electron mobility of the electron transport part 3 can be improved. At the same time, as the RGO carrier 321 is the π-electron rich planar system film per se, the electron mobility of the electron transport part 3 can be further improved due to good electron conductivity of the RGO carrier 321.

In addition, joule heat may occur at interface of the TMO nanoparticle film 322 as the PLED is powered on due to relatively high series resistance existed among TMO nanoparticles and, hence, lifespan of the PLED may be seriously impacted. In order to solve this problem, the nanocomposite layer 32, i.e. a TMO-RGO nanocomposite membrane, is formed by the TMO nanoparticle film 322 and the RGO carrier 321 in the present exemplary embodiment. Owing to unique appearance of the TMO nanoparticle film 322 per se, TM-O bond can be embedded anchor-likewise into the RGO carrier 321 having a 2D-$SP^2$ structure (a two dimensional structure formed by ordered arrangement of $SP^2$ hybridized carbon atoms in a shape of hexagonal honeycomb) to form TM-O—C (transition metal-oxygen-carbon) bond 323. On the one hand, the electron free path of electrons among the TMO-RGO nanocomposite membrane can be increased. On the other hand, the series resistance of TMO can be reduced. Accordingly, both the electron mobility of the electron transport part 3 and the lifespan of the PLED can be improved at the same time.

Figure 2:
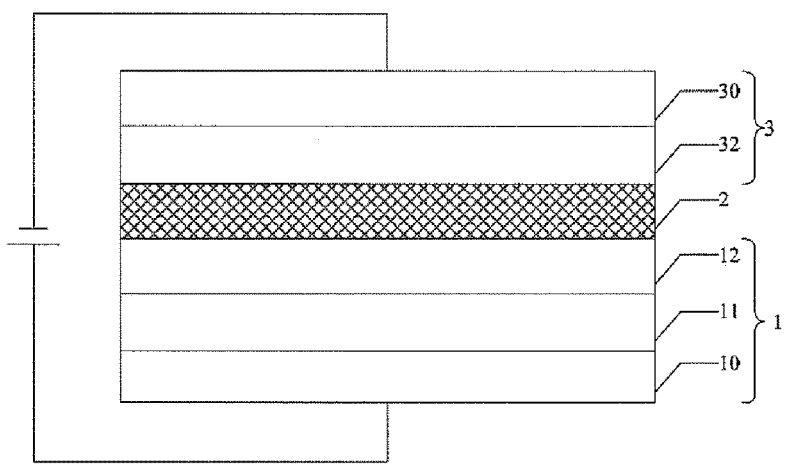
FIG. 2 is a schematic diagram illustrating a PLED according to an exemplary embodiment of the present disclosure.
Figure 4:
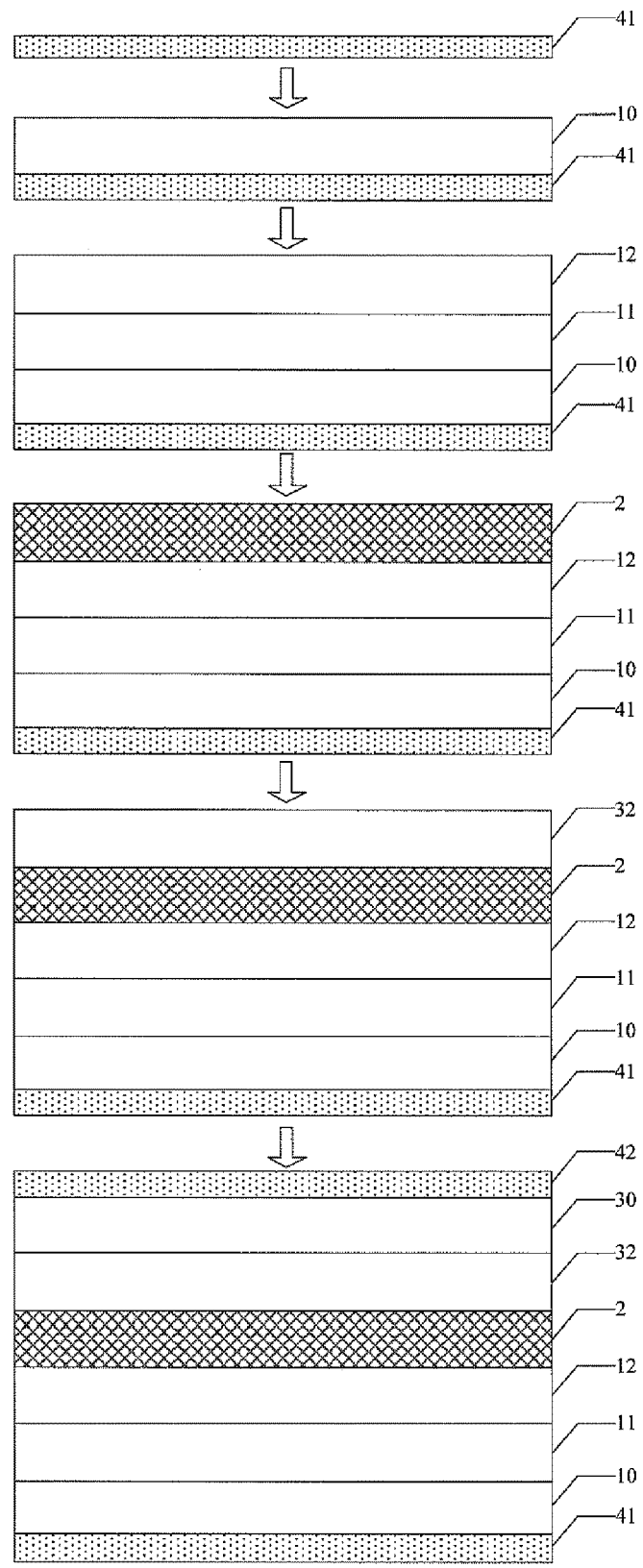
FIG. 4 is a flow chart illustrating a method for manufacturing the PLED according to FIG. 2.

As shown in FIG. 4, illustrating a flow chart of a method for manufacturing the PLED in FIG. 2, the method includes mainly following steps.

A first substrate 41 is provided, which may include rigid or flexible substrates formed of glass, silicon wafer, quartz, plastic or the like.

The hole transport part 1 is formed on the first substrate 41 to provide hole carriers. A step of forming the hole transport part 1 may include: forming an electrode of the anode 10, for example, a transparent ITO conductive membrane, on the first substrate 41 by means of processes such as vapor deposition; forming a HIL 11 on the anode 10, wherein the HIL 11 may include (3,4-ethylenedioxythiophene)-polystyrene sulfonic acid and the like; and forming the HTL 12 on the HIL 11, which may include polyvinyl carbazole and the like.

The organic light emitting layer 2 is formed on the hole transport part 1 and may include polyfluorene and derivatives thereof, polyvinyl carbazole, poly (2-(4-(3',7'-dimethyloctyloxy benzene)-1,4-phenylene vinylene) and the like.

The electron transport part 3 described above is formed on the organic light emitting layer 2 to provide electron carriers. The electron transport part 3 includes the nanocomposite layer 32 which may include the electron rich carrier 321, and the transition metal oxide or metalloid oxide nanoparticle film 322 anchored on the electron rich carrier 321.

Figure 5:
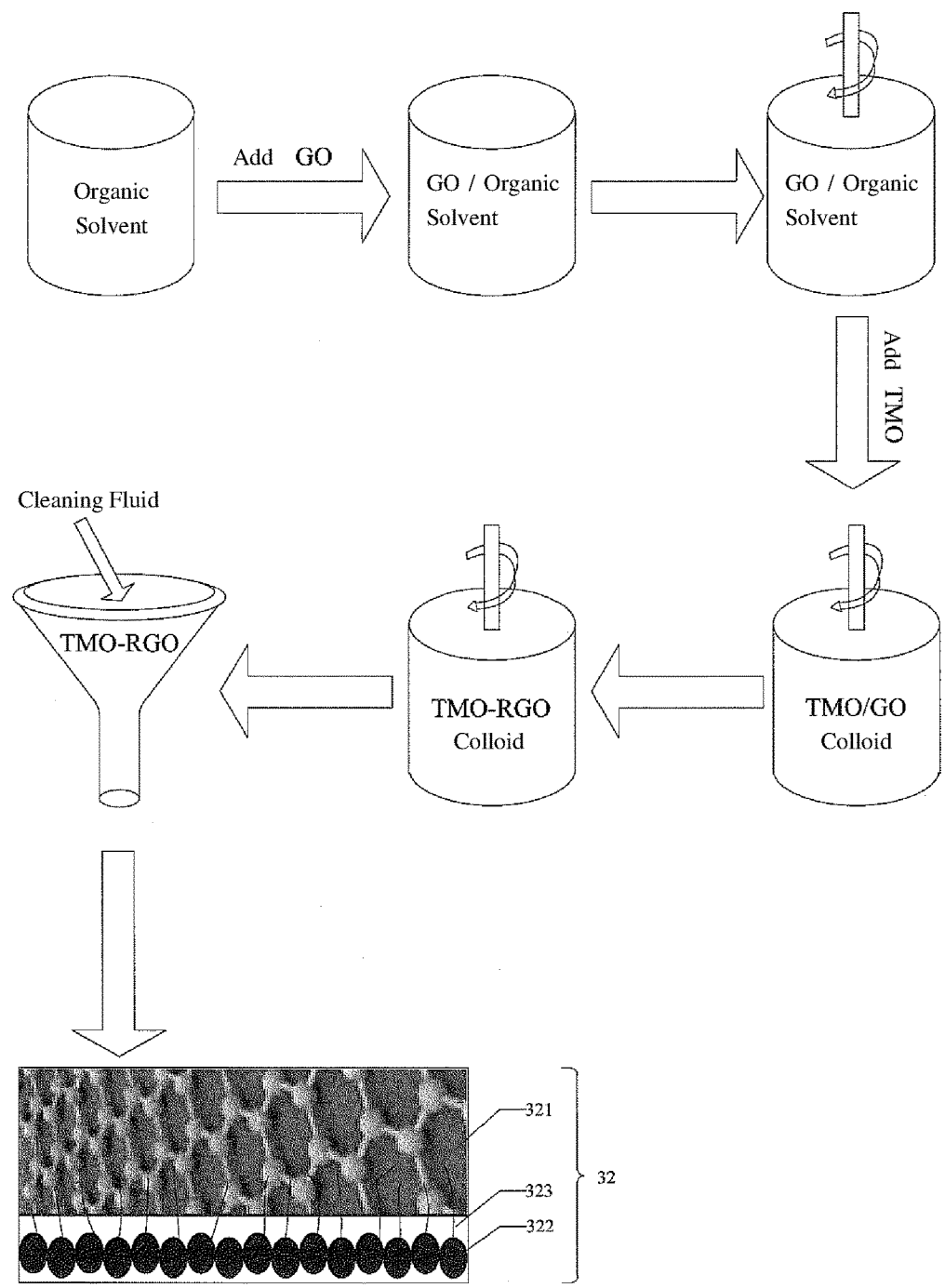
FIG. 5 is a flow chart illustrating a method for preparing the nanocomposite layer according to FIG. 2.

The nanocomposite layer 32 may be prepared by means of solution process in the present exemplary embodiment. As shown in FIG. 5, preparation of the TMO-RGO nanocomposite membrane 32 is taken for an example. Firstly, organic solvent such as ethyl alcohol is provided, and GO (intermediate during preparation of the RGO) is dissolved in the organic solvent. Secondly, TMO nanoparticles are added into the organic solvent to form TMO/GO colloid by stirring. Then, the TMO/GO colloid is subject to UV (ultraviolet light) irradiation to obtain TMO/RGO colloid. Subsequently, the TMO/RGO colloid is washed by cleaning fluid to obtain the nanocomposite layer 32.

The obtained material of the nanocomposite layer 32 is formed on the organic light emitting layer 2 by means of spin coating process or an inkjet printing process. Furthermore, the cathode 30, which may be made from transparent conductive materials, for example Al, Ca, In or Mg—Al alloy transparent conductive membrane, is formed on the nanocomposite layer 32. Processed described above may be understood by reference to related art, and details of which are omitted herein. Moreover, it should be understood that, FIG. 2 and FIG. 4 are just schematic diagrams of a local part corresponding to organic light emitting diode of PLED rather than an complete structure of PLED. The complete structure will be introduced below. Although layers are shown in FIGS. 2 and 4 with their ends flushed with each other, they may be formed in other forms as required and the embodiment is not limited thereto.

Figure 6:
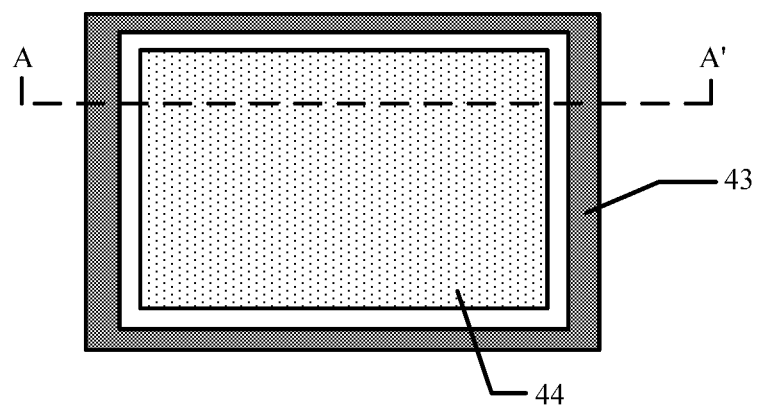
FIG. 6 is a schematic diagram illustrating a plan view of a PLED device.
Figure 7:
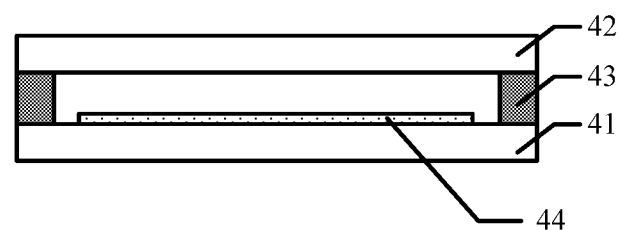
FIG. 7 is a schematic diagram illustrating a cross section view of the PLED device along line A-A' in FIG. 6.

Finally, the PLED is obtained through a package of the first substrate 41, the second substrate 42 and a seal member 43 as shown in FIGS. 6 and 7. The seal member 43 is provided around the organic light emitting diode 44 to keep moisture or oxygen from getting inside PLED panel and organic light emitting diode 44. In an embodiment, the first substrate 41 is a flexible substrate.

Furthermore, in order to better understand advantages of the disclosure, experimental tests are conducted aiming at the electron mobility of the nanocomposite layer 32 described above in the exemplary embodiments. As shown in following Table 1, tests of the electron mobility in experimental examples 1-4 are conducted in PLEDs, and membranes layers other than the electron transport layer of the PLEDs in the experimental examples 1-4 are correspondingly identical to each other. Materials of the electron transport layers in the experiment examples 1-4 may be adopted as $TiO_2$-RGO nanocomposite film, ZnO—RGO nanocomposite film, Alq3 (tris(8-hydroxyquinoline) aluminum) film and PEO (polyethylene oxide) film, respectively, with a same thickness. Experimental results are obtained as shown in following Table 1.

TABLE 1

| Experimental example | Electron mobility ($cm^2$/V/S) |
|---|---|
| Experimental example 1 | $4.5 \times 10^{-4}$ |
| Experimental example 2 | $3.7 \times 10^{-4}$ |
| Experimental example 3 | $1.4 \times 10^{-6}$ |
| Experimental example 4 | $10^{-6}$ |

As can be seen from Table 1, as far as conventional materials of electron transport layer as concerned, either the high polymer material PEO or the small molecule materials $Alq_3$, magnitude order thereof is $10^{-6}$ $cm^2$/V/S. In the present exemplary embodiments, magnitude order of the materials of electron transport layer is raised to $10^{-4}$ $cm^2$/V/S. Herein, the electron mobility of the $TiO_2$-RGO nanocomposite film and that of the ZnO-RGO nanocomposite film are $4.5 \times 10^{-4}$ and $3.7 \times 10^{-4}$, respectively. Thus, it is indicated that, compared to conventional technology, the electron mobility may be sharply raised for the nanocomposite layer in the present exemplary embodiments and, hence, a balance can be kept between the electron transport capability and the hole transport capability in the PLED.

Furthermore, in order to better understand advantages of the disclosure, experimental tests are further conducted aiming at the performance of the PLED with the nanocomposite membrane according to the exemplary embodiments. As shown in following Table 2, membranes layers other than the electron transport layer of the PLEDs in the experimental examples 5-8 are correspondingly identical to each other. Materials of the electron transport layers in the experiment examples 5-8 may be adopted as $TiO_2$-RGO nanocomposite film, ZnO-RGO nanocomposite film, Alq3 (tris(8-hydroxyquinoline) aluminum) film and PEO (polyethylene oxide) film, respectively, with a same thickness. Experimental results are obtained as shown in following Table 2.

TABLE 2

| Experimental example | HOMO energy level | LUMO energy level | Current efficiency @10 mA |
|---|---|---|---|
| Experimental example 5 | 7.6 ev | 4.3 ev | 20.12 cd/A |
| Experimental example 6 | 7.6 ev | 4.3 ev | 18.56 cd/A |
| Experimental example 7 | 5.7 ev | 2.8 ev | 5.18 cd/A |
| Experimental example 8 | Untested | Untested | 4.96 cd/A |

As can be seen from Table 2, compared to OLEDs with electron transport layers adopting conventional materials (PEO or $Alq_3$), current efficiency of the OLEDs with electron transport layers ($TiO_2$-RGO nanocomposite film, ZnO-RGO nanocomposite film) according to the present exemplary embodiments can be raised to about 20 cd/A from about 5 cd/A. That is, the current efficiency is substantially improved.

Furthermore, there is provided a display panel in the present exemplary embodiment. The display panel includes a first substrate, a second substrate, a seal member and the PLED described above. The first substrate and the second substrate are provided opposite to each other. The organic light emitting diode is provided between the first substrate and the second substrate. The seal member is provided around the organic light emitting diode and configured to package the organic light emitting diode between the first substrate and the second substrate. A balance can be kept between the electron transport capability and the hole transport capability of the PLED and, hence, the excitons can be held within the organic light emitting layer. Accordingly, current efficiency of the PLED can be improved, and so can display quality of the display panel.

The disclosure has been described by reference to the embodiments above which are merely examples for implementing the disclosure. It should be noted that the present disclosure is not limited to the exact embodiments that have been described above. Instead, various modifications and changes can be made without departing from concept and scope of the disclosure and should be covered by protection scope thereof.

What is claimed is:

1. An organic light emitting diode comprising:
   an organic light emitting layer having a first surface and a second surface opposite to each other;
   a hole transport part formed on the first surface of the organic light emitting layer, comprising an anode, a hole injection layer and a hole transport layer stacked sequentially; and
   an electron transport part formed on the second surface of the organic light emitting layer, the electron transport part comprising a nanocomposite layer and a cathode formed on the nanocomposite layer,
   wherein the nanocomposite layer comprises graphene and metalloid oxide.

2. The organic light emitting diode of claim 1, wherein the metalloid in the metalloid oxide is selected from IIIA group, IVA group, VA group, and VIA group.

3. The organic light emitting diode of claim 1, wherein the organic light emitting diode is a polymer light emitting diode.

4. A method for manufacturing an organic light emitting diode comprising:
   forming a hole transport part configured to provide hole carriers;
   forming an organic light emitting layer having a first surface and a second surface opposite to each other, the hole transport part being formed on the first surface of the organic light emitting layer and comprising an anode, a hole injection layer and a hole transport layer stacked sequentially; and
   forming an electron transport part on the second surface of the organic light emitting layer, the electron transport part comprising a nanocomposite layer and a cathode formed on the nanocomposite layer,
   wherein the nanocomposite layer comprises graphene and metalloid oxide.

5. The method of claim 4, wherein the nanocomposite layer comprises:
   an electron rich carrier, and
   a nanoparticle film, comprising transition metal oxide or metalloid oxide, anchored to the electron rich carrier.

6. The method of claim 5, wherein the forming the electron transport part comprises:
   preparing the nanocomposite layer by means of solution process, and
   forming material of the nanocomposite layer on the organic light emitting layer by a method selected from a spin coating process and an inkjet printing process.

7. An organic light emitting display panel comprising:
   a first substrate;
   a second substrate provided opposite to the first substrate;
   an organic light emitting diode according to claim 1 provided between the first substrate and the second substrate; and
   a seal member provided around the organic light emitting diode and configured to package the organic light emitting diode between the first substrate and the second substrate.

8. The organic light emitting diode of claim 1, wherein the metalloid oxide comprises $Ge_2O_5$ or $As_2O_5$.

* * * * *